United States Patent
Tobimatsu et al.

(10) Patent No.: US 6,759,317 B2
(45) Date of Patent: Jul. 6, 2004

(54) METHOD OF MANUFACTURING SEMICONDUCTOR DEVICE HAVING PASSIVATION FILM AND BUFFER COATING FILM

(75) Inventors: Hiroshi Tobimatsu, Tokyo (JP); Yuuki Kamiura, Hyogo (JP); Seiji Okura, Seiji (JP); Mahito Sawada, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/910,824

(22) Filed: Jul. 24, 2001

(65) Prior Publication Data

US 2002/0090809 A1 Jul. 11, 2002

(30) Foreign Application Priority Data

Jan. 5, 2001 (JP) ........................................ 2001-000408

(51) Int. Cl.[7] .............................................. H01L 21/44
(52) U.S. Cl. ........................ 438/612; 438/623; 438/688; 438/706; 438/725
(58) Field of Search ................................ 438/612, 623, 438/688, 706, 725; 430/311, 313, 317, 330

(56) References Cited

U.S. PATENT DOCUMENTS 5,807,787 A * 9/1998 Fu et al. ...................... 438/623
6,127,099 A * 10/2000 Shinohara ................... 430/317
6,287,750 B1 * 9/2001 Sakurai ....................... 430/313

FOREIGN PATENT DOCUMENTS

JP 4-179124 6/1992
TW 414989 12/2000

* cited by examiner

*Primary Examiner*—Hsien Ming Lee
(74) *Attorney, Agent, or Firm*—McDermott, Will & Emery

(57) ABSTRACT

An interconnection is formed on a semiconductor substrate having a semiconductor element formed thereon. Next, a passivation film is formed on the semiconductor substrate including the interconnection. Further, a polyimide film, which is served as a buffer coating film, is formed on the passivation film. Further, the polyimide film is patterned. Next, the passivation film is subject to etching while the patterned polyimide film is taken as a mask. Next, a hardened layer, which is formed on the surface of the polyimide film as a result of etching, is removed through ashing process. Next, the semiconductor substrate after ashing process is cured so as to transform the polyimide film into imide.

5 Claims, 3 Drawing Sheets

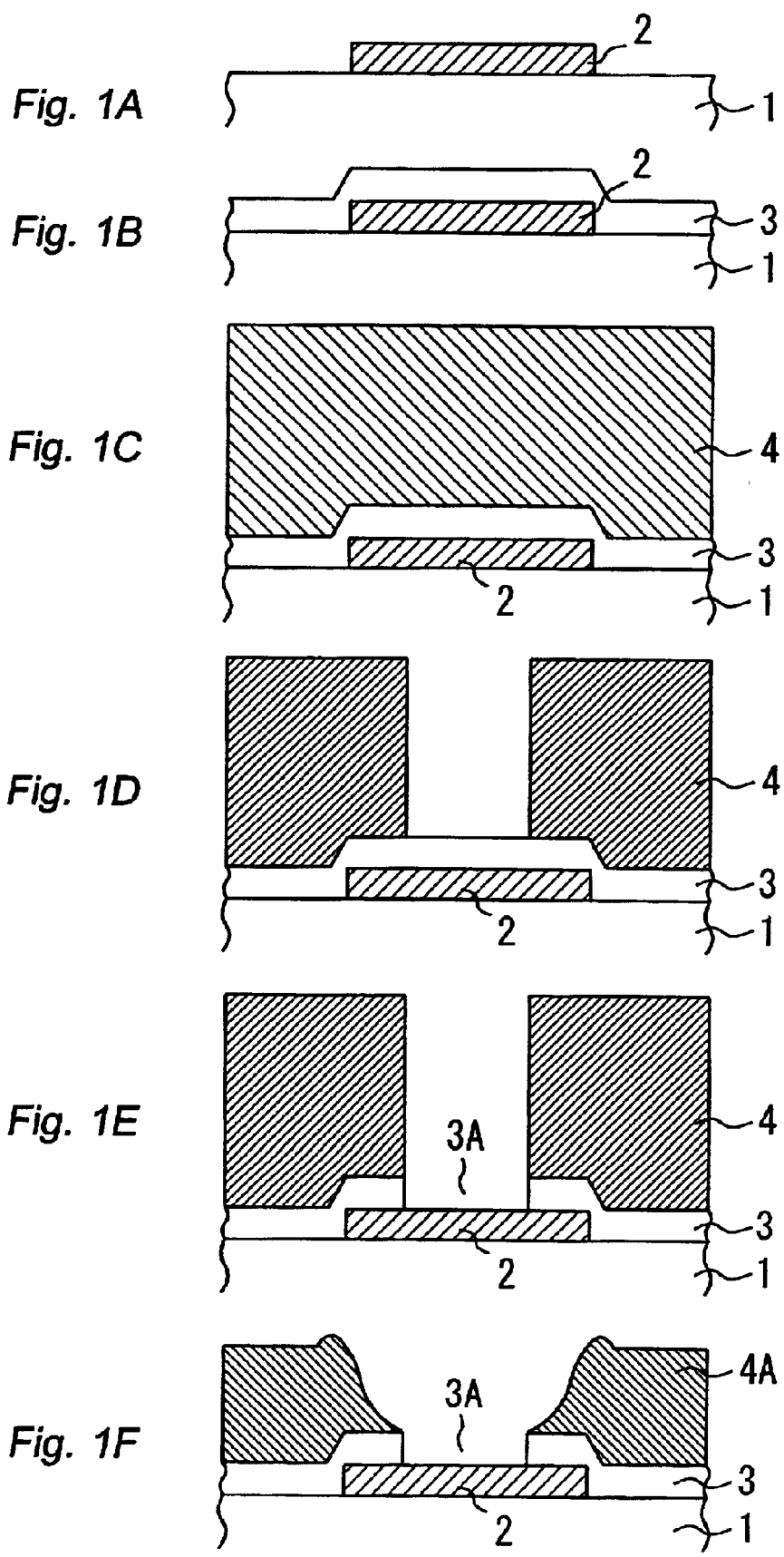

Background Art

METHOD OF MANUFACTURING SEMICONDUCTOR DEVICE HAVING PASSIVATION FILM AND BUFFER COATING FILM

BACKGROUND OF THE INVENTION

1. Field of the Invention

The present invention relates to a method of manufacturing a semiconductor device, and more particularly, to a method of manufacturing a semiconductor device having a buffer coating film and a passivation film serving as a surface protective film.

2. Description of the Background Art

FIGS. 3A to 3F are views for describing a conventional method for manufacturing a semiconductor device having a passivation film and a buffer coating film.

A conventional method for manufacturing a semiconductor device will now be described.

First, as shown in FIG. 3A, an aluminum interconnection 2 is formed on a semiconductor substrate 1. Here, although not shown, semiconductor elements are formed on the semiconductor substrate 1.

Next, as shown in FIG. 3B, a passivation film 3 formed from $SiO_2$ or $Si_3N_4$ is formed on the entire surface of the semiconductor substrate 1 containing the aluminum interconnection 2.

Next, as shown in FIG. 3C, a buffer coating film 4 is formed on the passivation film 3. Here, polyimide having superior moisture resistance and chemical resistance is used for the buffer coating film 4. Varnish formed by dissolving polyamic acid, which is a precursor of polyimide, with an organic solvent is applied on the passivation film 3 by means of spin coating.

Next, as shown in FIG. 3D, the polyimide film 4 is patterned by means of a known photolithography technique.

Here, if employed polyimide is non-photosensitive, photoresist is formed on the polyimide film 4. Then, the photoresist is subjected to exposure and development, thereby forming a desired photoresist pattern. Subsequently, the polyimide is subjected to etching with the photoresist pattern as a mask, thereby forming a desired pattern.

In contrast, if employed polyimide is photosensitive, the photoresist is unnecessary. Namely, after formation of the polyimide film 4 on the passivation film 3, the polyimide film 4 is subjected to exposure and development. Thereby, a desired pattern is formed.

Next, after patterning of the polyimide film 4, the polyimide film 4 is cured at 300° C. through 450° C. for the purpose of transforming polyimide into imide and vaporizing a solvent. Further, in the case of photosensitive polyimide, the polyimide film 4 is cured for the purpose of vaporizing a photosensitive group in addition to the above-described purposes. As a result, as shown in FIG. 3E, there is formed a polyimide film 4A.

Finally, as shown in FIG. 3F, the passivation film 3 is etched while the cured polyimide film 4A is taken as a mask, thus exposing the aluminum interconnection 2.

As mentioned above, the conventional method of manufacturing a semiconductor device comprises the foregoing steps. The passivation film 3 is etched while the cured polyimide film 4A is taken as a mask. Polyimide undergoes a volumetric shrinkage of about 50% when being cured. Before being cured, the sidewall of the polyimide pattern is substantially vertical, as shown in FIG. 3D. In contrast, after having been cured, the sidewall becomes tapered; for example, as shown in FIG. 3E.

When the passivation film 3 is etched while the cured polyimide film 4A is used as a mask, the polyimide film 4A—which is located in the vicinity of the passivation film 3 and has a small thickness—is also etched away along with the passivation film 3. As a result, the finished dimension of a portion 3A of the passivation film 3 to be etched becomes difficult, thus resulting in variations in the finished dimension.

SUMMARY OF THE INVENTION

The present invention has been conceived to solve the previously-mentioned problems and a general object of the present invention is to provide a novel and useful method of manufacturing a semiconductor device.

A more specific object of the present invention is to provide a method of manufacturing a semiconductor device which enables an improvement in the dimension control of a portion of a passivation film to be etched.

The above object of the present invention is attained by a following method of manufacturing a semiconductor device.

According to one aspect of the present invention, in a method of manufacturing a semiconductor device, an interconnection is formed on a semiconductor substrate having a semiconductor element formed thereon. Next, a passivation film is formed on the semiconductor substrate including the interconnection. Further, a polyimide film, which is served as a buffer coating film, is formed on the passivation film. Further, the polyimide film is patterned. Next, the passivation film is subject to etching while the patterned polyimide film is taken as a mask. Next, a hardened layer, which is formed on the surface of the polyimide film as a result of etching, is removed through ashing. Next, the semiconductor substrate is cured after ashing so as to transform the polyimide film into imide.

Accordingly, since the semiconductor substrate is cured after etching, the dimensional accuracy of processing of a passivation film can be improved.

Further, since the semiconductor substrate is cured after ashing, quality of the polyimide film can be improved.

BRIEF DESCRIPTION OP THE DRAWINGS

FIGS. 1A to 1F are cross-sectional views for describing a method of manufacturing a semiconductor device according to a first embodiment of the present invention;

DETAILED DESCRIPTION OF THE PREFERRED EMBODIMENTS

Figure 2A:
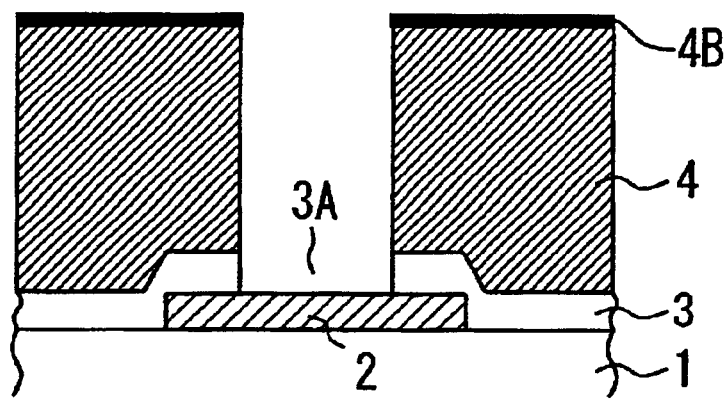
FIG. 2A is a cross-sectional view for describing a semiconductor device after finishing a etching process.

In the following, principles and embodiments of the present invention will be described with reference to the accompanying drawings. The members and steps that are common to some of the drawings are given the same reference numerals and redundant descriptions therefore may be omitted.

First Embodiment

FIGS. 1A to 1F are cross-sectional views for describing a method of manufacturing a semiconductor device according to a first embodiment of the present invention.

First, as shown in FIG. 1A, an aluminum interconnection 2 is formed on the semiconductor substrate 1. Here, although not shown, a plurality of semiconductor elements is formed on the semiconductor substrate 1.

Next, as shown in FIG. 1B a passivation film 3 made of $SiO_2$ or $Si_3N_4$ is formed as a single layer or a multilayer to a thickness of 100 nm to 2000 nm on the entire surface of the semiconductor substrate 1 including the aluminum interconnection 2.

Next, as shown in FIG. 1C, a buffer coating film 4 is formed on the passivation film 3. Here, polyimide having superior moisture resistance and chemical resistance is used for the buffer coating film 4. Varnish formed by dissolving polyimide or polyamic acid, which is a precursor thereof, with an organic solvent such a NMP (N-methylpyrrolidone) is usually applied on the passivation film 3 by means of spin coating.

Next, as shown in FIG. 1D, the polyimide film 4 is patterned by means of a known photolithography technique.

Here, if employed polyimide is non-photosensitive, photoresist is formed on the polyimide film 4. Then, the photoresist is subjected to exposure and development, thereby forming a desired photoresist pattern. Subsequently, the polyimide is subjected to etching with the photoresist pattern as a mask, thereby forming a desired pattern.

In contrast, if employed polyimide is photosensitive, the photoresist is unnecessary. Namely, after formation of the polyimide film 4 on the passivation film 3, the polyimide film 4 is subjected to exposure and development. Thereby, a desired pattern is formed.

Here, the polyimide film 4 usually assumes a thickness of several to tens of micrometers, and isotropic etching (e.g. wet etching) is employed when the polyimide film 4 is to be etched. Further, the polyimide film 4 encounters difficulty in controlling the dimension of a pattern to be formed by means of isotropic etching. Accordingly, use of photosensitive polyimide is advantageous and preferable.

Next, as shown in FIG. 1E, the passivation film 3 is etched while the patterned polylmide film 4 is taken as a mask, thus exposing the aluminum interconnection 2. Here, as mentioned above, the passivation film 3 is formed from $SiO_2$ or $Si_3N_4$. Therefore, at the time of etching of the passivation film 3, dry etching through use of $CF_4$ gas or a like gas is usually employed.

In this case, the polylmide film 4 to be taken as a mask is not yet cured. Accordingly, as shown in FIG. 1E, the sidewall of the patterned polyimide film 4 forming an opening assumes a substantially perpendicular geometry. Hence, the finished dimension of a portion 3A, to be etched, of the passivation film 3 has superior controllability.

Next, after etching, the passivation film 3 is cured for the purpose of transforming polyimide:into imide and evaporating a solvent and a photosensitive group. Here, the condition of curing is a temperature of 300° C. to 450° C. and a time of about 0.1 to several hours. Thereby, there is obtained a polyimide film 4A having a profile such as that shown in FIG. 1F.

In the present embodiment, the passivation film 3 is etched while the pre-cured polyimide film 4 is used as a mask. Here, a sidewall of an opening section formed in the polyimide film 4 assumes a substantial perpendicular geometry. Therefore, the dimensional accuracy of processing of the portion 3A to be etched is improved.

Then, depending on conditions under which the passivation film 3 is to be etched, the surface of the polylmide film 4 may become hot. Due to damage stemming from etching, a hardened polyimide layer 4B is formed on the surface of the polyimide film 4, as shown in FIG. 2A.

In the case, when the polyimide film 4 is cured in this state, volumetric shrinkage arises in the polyimide film 4 in the manner as mentioned previously. In contrast, no volumetric change arises in the hardened layer 4B. Therefore, as shown in FIGS. 2B and 2C, the hardened layer 4B causes a myriad of wrinkles 4C to arise in the surface of the polyimide film 4A.

In the case that the wrinkles 4C have arisen, adhesion between sealing resin and the polyimide film 4A may deteriorate, when a semiconductor device is encapsulated in resin.

Figure 2B:
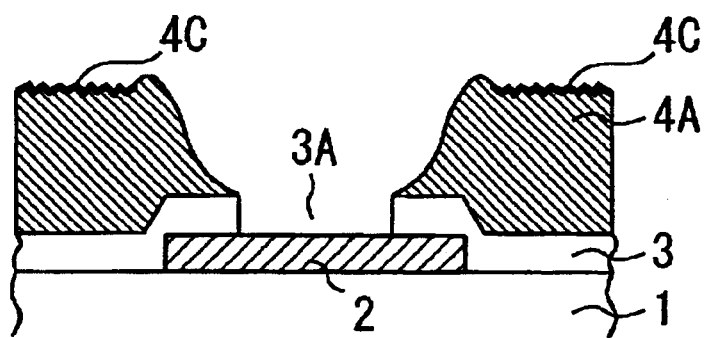
FIG. 2B is a cross-sectional view for describing a semiconductor device cured without ashing.
Figure 2C:
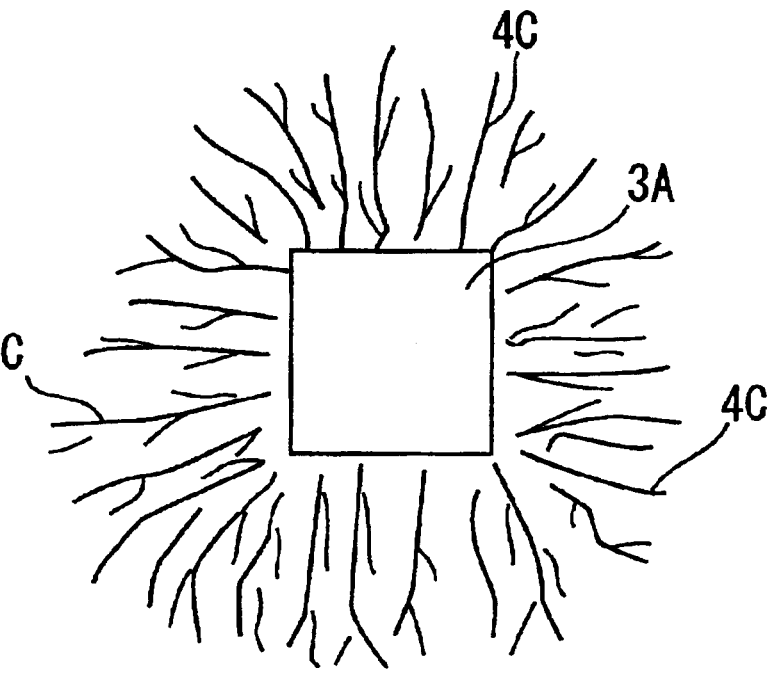
FIG. 2C is a plan view for describing a semiconductor device cured without ashing.
Figure 3A:
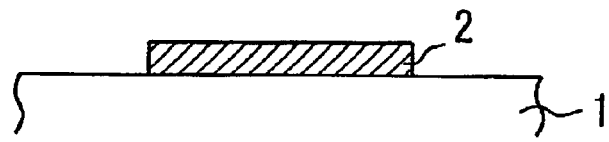
FIGS. 3A to 3F are cross-sectional views for describing a conventional method of manufacturing a semiconductor device.
Figure 3B:
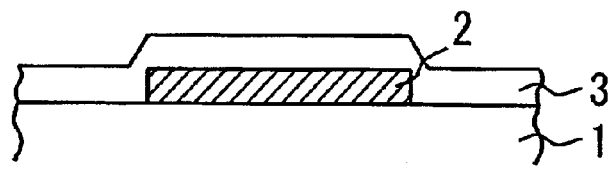
Figure 3C:
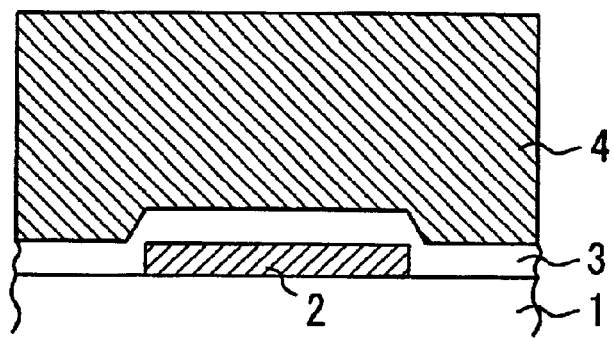
Figure 3D:
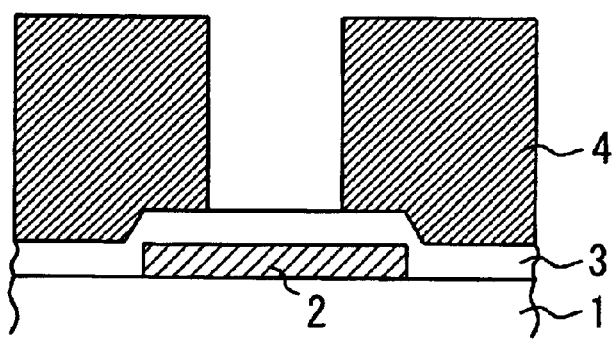
Figure 3E:
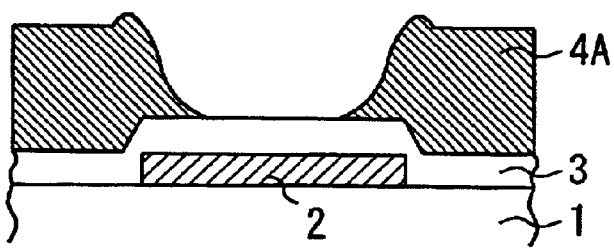
Figure 3F:
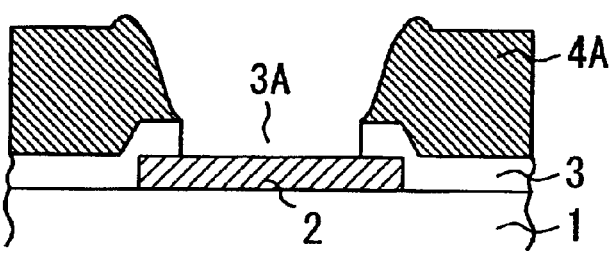

Accordingly, in the present embodiment, after etching of the passivation film 3; that is, when the substrate 1 is in a state shown in FIG. 2A, the polyimide film 4 including the hardened layer 4B is subjected to ashing through use of oxygen plasma.

Here, the polyimide film 4 is subjected to ashing under conditions such that the surface of the polyimide film 4 is removed by a predetermined thickness of, e.g., 0.1 $\mu$m to several micrometers. As a result, the hardened layer 4B is removed.

Subsequently, the semiconductor substrate 1 is cured. Thus, there is produced a superior polyimide film 4A without wrinkles, such as that shown in FIG. 1F.

As mentioned above, in the method of manufacturing a semiconductor device according to the first embodiment, the aluminum interconnection 2 is formed on the semiconductor substrate 1 having a semiconductor element formed thereon. Next, the passivation film 3 is formed on the semiconductor substrate 1 including the interconnection 2. Further, the polyimide film 4, which is served as a buffer coating film, is formed on the passivation film 3. Further, the polyimide film 4 is patterned. Next, the passivation film 3 is subject to etching while the patterned polyimide film 4 is taken as a mask. Next, a hardened layer 4B, which is formed on the surface of the polyimide film 4 as a result of etching, is removed through ashing. Next, the semiconductor substrate 1 after ashing is cured so as to transform the polyimide film into imide.

Therefore, since the semiconductor substrate 1 is cured after etching, the polyimide film 4 is not etched away when the passivation film 3 is subject to etching process. Thus, the dimensional accuracy of processing of the passivation film 3 can be improved.

Further, since the hardened layer 4B is removed through ashing, generation of wrinkles 4C can be prevented. Thus, quality of the polyimide film 4 can be improved.

This invention, when practiced illustratively in the manner described above, provides the following major effects:

According to one aspect of the present invention, a method of manufacturing a semiconductor device comprises the steps of: forming an interconnection on a semiconductor substrate having a semiconductor element formed thereon; forming a passivation film on the semiconductor substrate including the interconnection; forming a polyimide film, which is served as a buffer coating film, on the passivation film; patterning the polyimide film; etching the passivation film while the patterned polyimide film is taken as a mask; removing, through ashing, a hardened layer formed on the surface of the polyimide film as a result of etching; and curing the semiconductor substrate after ashing so as to transform the polyimide film into imide.

Accordingly, the dimensional accuracy of processing of a passivation film and quality of the polyimide film can be improved.

Further, the present invention is not limited to these embodiments, but variations and modifications may be made without departing from the scope of the present invention.

The entire disclosure of Japanese Patent Application No. 2001-000408 filed on Jan. 5, 2001 containing specification, claims, drawings and summary are incorporated herein by reference in its entirety.

What is claimed is:

1. A method of manufacturing a semiconductor device comprising the steps of:

forming an interconnection on a semiconductor substrate having a semiconductor element formed thereon;

forming a passivation film on the semiconductor substrate including the interconnection;

forming a polyimide film, which serves as a buffer coating film, on the passivation film;

patterning the polyimide film;

etching the passivation film, while the patterned polyimide film is used as a mask, under conditions which form a hardened polyimide layer on the surface of the polyimide film;

ashing to remove 0.1 $\mu$m to several micrometers of the polyimide film, thereby removing the hardened layer formed on the surface of the polyimide film as a result of said step of etching; and curing the semiconductor substrate after ashing process so as to transform the polyimide film into imide.

2. The method of manufacturing a semiconductor device according to claim 1, wherein the polyimide film is formed by means of applying varnish which is formed by dissolving into an organic solvent polyamic acid serving as a precursor of polyimide.

3. The method of manufacturing a semiconductor device according to claim 1, wherein the polyimide film is a photosensitive polyimide film.

4. The method of manufacturing a semiconductor device according to claim 1, wherein in said step of removing, ashing process is effected through use of oxygen plasma.

5. The method of manufacturing a semiconductor device according to claim 1, wherein said step of curing is effected at 300° C. to 450° C. for 0.1 to several hours.

* * * * *